US010672968B2

(12) United States Patent
McGuinness et al.

(10) Patent No.: US 10,672,968 B2
(45) Date of Patent: Jun. 2, 2020

(54) THERMOELECTRIC DEVICES

(71) Applicant: Analog Devices Global, Hamilton (BM)

(72) Inventors: Patrick M. McGuinness, Pallaskenry (IE); Helen Berney, Limerick (IE); Jane Cornett, Wilmington, MA (US); William Alan Lane, Waterfall (IE); Baoxing Chen, Westford, MA (US)

(73) Assignee: Analog Devices Global, Hamilton (BM)

( * ) Notice: Subject to any disclaimer, the term of this patent is extended or adjusted under 35 U.S.C. 154(b) by 660 days.

(21) Appl. No.: 14/805,135

(22) Filed: Jul. 21, 2015

(65) Prior Publication Data

US 2017/0025594 A1 Jan. 26, 2017

(51) Int. Cl.
*H01L 35/32* (2006.01)
*H01L 35/18* (2006.01)

(52) U.S. Cl.
CPC .............. *H01L 35/32* (2013.01); *H01L 35/18* (2013.01)

(58) Field of Classification Search
CPC ...................................................... H01L 35/32
See application file for complete search history.

(56) References Cited

U.S. PATENT DOCUMENTS

| 3,870,568 A | 3/1975 | Oesterhelt et al. |
| 4,257,822 A | 3/1981 | Gomez |
| 5,006,178 A | 4/1991 | Bijvoets |
| 5,022,928 A | 6/1991 | Buist |
| 5,610,366 A | 3/1997 | Fleurial et al. |
| 5,747,728 A | 5/1998 | Fleurial et al. |
| 6,100,463 A | 8/2000 | Ladd et al. |

(Continued)

FOREIGN PATENT DOCUMENTS

CN 101887944 A 11/2010

OTHER PUBLICATIONS

Riffat et al., "Thermoelectrics: A Review of Present and Potential Applications," Applied Thermal Engineering, No. 23, pp. 913-935, 2003.

(Continued)

*Primary Examiner* — Sadie White
(74) *Attorney, Agent, or Firm* — Wolf, Greenfield & Sacks, P.C.

(57) ABSTRACT

An embodiment of a thermoelectric device may include a plurality of thermoelectric cells disposed between first and second planes. Each of the thermoelectric cells may include a thermoelectric element formed from a thermoelectric material of a single semiconductor type, the thermoelectric element including a first end, a second end, and a portion extending from the first end to the second end, the portion extending from the first end to the second end including at least two surfaces that face each other; and at least one conductive element electrically connected to and extending away from the second end of the thermoelectric element toward the first end of the thermoelectric element of another thermoelectric cell. Each thermoelectric cell also may further include an insulating element disposed between the at least two surfaces of the thermoelectric element and between portions of the at least one conductive element.

20 Claims, 4 Drawing Sheets

(56) References Cited

U.S. PATENT DOCUMENTS

| | | | |
|---|---|---|---|
| 6,232,542 B1* | 5/2001 | Hiraishi | H01L 35/34 136/201 |
| 6,614,122 B1 | 9/2003 | Dory et al. | |
| 7,629,531 B2 | 12/2009 | Stark | |
| 8,399,300 B2 | 3/2013 | Lee et al. | |
| 8,853,799 B2 | 10/2014 | O'Donnell et al. | |
| 8,957,488 B2 | 2/2015 | Keysar et al. | |
| 2005/0139249 A1 | 6/2005 | Ueki et al. | |
| 2006/0000502 A1* | 1/2006 | Fiorini | H01L 35/30 136/224 |
| 2006/0048809 A1* | 3/2006 | Onvural | B82Y 10/00 136/212 |
| 2006/0118159 A1 | 6/2006 | Tsuneoka et al. | |
| 2006/0151021 A1 | 7/2006 | Stark | |
| 2008/0178606 A1 | 7/2008 | Chen et al. | |
| 2010/0205920 A1 | 8/2010 | Czubarow et al. | |
| 2010/0252086 A1* | 10/2010 | Fujie | C30B 11/002 136/238 |
| 2011/0041887 A1 | 2/2011 | Takahashi | |
| 2011/0209740 A1 | 9/2011 | Bell et al. | |
| 2011/0209744 A1 | 9/2011 | Hu | |
| 2011/0220162 A1 | 9/2011 | Siivola et al. | |
| 2011/0315194 A1* | 12/2011 | Hu | H01L 35/32 136/246 |
| 2012/0000500 A1* | 1/2012 | Iida | H01L 35/08 136/200 |
| 2012/0031450 A1 | 2/2012 | Kittler et al. | |
| 2012/0090656 A1 | 4/2012 | Snyder et al. | |
| 2012/0103379 A1 | 5/2012 | Krinn et al. | |
| 2013/0014516 A1 | 1/2013 | Yang et al. | |
| 2013/0081665 A1 | 4/2013 | Span | |
| 2013/0133338 A1 | 5/2013 | Ludwig | |
| 2013/0218241 A1 | 8/2013 | Savoy et al. | |
| 2014/0190542 A1 | 7/2014 | Lane et al. | |
| 2014/0190543 A1 | 7/2014 | Chen et al. | |
| 2014/0246066 A1 | 9/2014 | Chen et al. | |
| 2015/0001729 A1 | 1/2015 | Lan et al. | |
| 2017/0040522 A1* | 2/2017 | Yamashita | H01L 35/32 |

OTHER PUBLICATIONS

Xie et al., "Design, Fabrication, and Characterization of CMOS MEMS-Based Thermoelectric Power Generators," IEEE Journal of Microelectromechanical Systems, vol. 19, No. 2, pp. 317-321, Apr. 2010.

Bell, "Cooling, Heating, Generating Power, and Recovering Waste Heat with Thermoelectric Systems," Science, vol. 321, pp. 1457-1461, Sep. 2008.

Borgesen, "Flip Chip on Organic Substrates," SMTA International Conference Proceedings, Sep. 1999, 9 pages.

Caillat et al., "Development of High Efficiency Segmented Thermoelectric Unicouples," Proceedings of the XX International Conference on Thermoelectrics (ICT 2001), Jun. 2001, 4 pages.

E.S. Reddy et al., "Fabrication and Properties of Four-Leg Oxide Thermoelectric Modules," Journal of Physics D: Applied Physics, No. 38, pp. 3751-3755, Sep. 2005.

Meng et al., "Multi-Objective and Multi-Parameter Optimization of a Thermoelectric Generator Module," Energy, vol. 71, pp. 367-376, Jul. 2014.

Mijatovic et al., "Technologies for Nanofluidic Systems: Top-down vs. Bottom-up—a Review," Lab on a Chip, Issue 5, 2005, pp. 492-500, first published Mar. 22, 2005.

O'Toole et al., "A Solid-Liquid-Vapor Mechanism for Anisotropic Silicon Etching," Applied Physics Letters 93, 263107 (2008), 3 pages.

Strasser et al., "Micromachined CMOS Thermoelectric Generators as On-Chip Power Supply," 12th International Conference on Solid-State Sensors, Actuators and Microsystems (Transducers 2003), pp. 45-48, Jun. 2003.

Y.T. Yeh et al., "Threshold Current Density of Electromigration in Eutectic SnPb Solder," Applied Physics Letters 86, 203504 (2005), 3 pages.

* cited by examiner

THERMOELECTRIC DEVICES

BACKGROUND INFORMATION

Thermoelectric devices are used to harvest electrical energy from a thermal energy source as a function of heat flow through materials in the device sweeping charge carriers in the materials in the direction of the heat flow.

Prior thermoelectric device configurations typically include a first bar of a first material of a first charge carrier type, such as an n-type semiconductor, arranged between a hot surface and a cold surface, and a second bar of a second material of a second charge carrier type, such as a p-type semiconductor, also arranged between the hot surface and the cold surface, and electrically connected to the first bar at one end. As heat flows from the hot surface to the cold surface through the first bar, charge carriers in the first bar, such as electrons in an n-type semiconductor, are swept in the same direction. Similarly, as heat flows from the hot surface to the cold surface through the second bar, charge carriers in the second bar, such as holes in a p-type semiconductor, are also swept in that same direction. From an electrical perspective, a current flows from the hot surface to the cold surface through the first bar, through the electrical connection to the second bar, and from the cold surface to the hot surface through the second bar, resulting in a corresponding power generation. Prior devices may connect a plurality of these configurations in series to increase the power generated.

However, such configurations suffer from several problems. First, one of the two different types of materials may have better thermoelectric properties than the other, such as generating a greater current flow from the same amount of material in response to the same heat flow, potentially leading to inefficiencies in both power generation and device area utilization. Second, manufacturing different materials of different charge carrier types in the same device typically requires separate complex processing steps, and associated costs, for each material.

Therefore, a need exists for thermoelectric devices that provide one or more of improved power generation, device area utilization, manufacturing simplicity or cost.

BRIEF DESCRIPTION OF THE DRAWINGS

So that features of the present invention may be understood, a number of drawings are described below. However, the appended drawings illustrate only particular embodiments of the invention and are therefore not to be considered limiting of its scope, for the invention may encompass other equally effective embodiments.

DETAILED DESCRIPTION OF EXAMPLE EMBODIMENTS

An embodiment of a thermoelectric device may include a plurality of thermoelectric cells disposed between first and second parallel planes. Each of the thermoelectric cells may include a thermoelectric element to convert thermal energy to electrical energy. The thermoelectric elements of the plurality of cells may be formed from a thermoelectric material of a single semiconductor type, such as either an n-type semiconductor or a p-type semiconductor. Providing thermoelectric elements for the plurality of cells of only a single semiconductor type may reduce the complexity and cost of manufacturing the thermoelectric device by eliminating processing steps required to provide thermoelectric material of a second semiconductor type.

The thermoelectric element also may be configured so that the thermoelectric element extends from a first end at or oriented to the first plane to a second end at or oriented to the second plane via a third, or transverse, portion that folds or bends around an insulating element of the cell so that interior surfaces of the thermoelectric element face each other. The first end of the thermoelectric element may flange outward from the transverse portion to provide a first thermal conduction surface and a first electrical connection to the thermoelectric element. The second end of the thermoelectric element may cap the transverse portion to provide a second thermal conduction surface and second electrical connection to the thermoelectric element. The transverse portion may extend from the first end to the second end at an angle relative to the first and second planes of, in one embodiment, less than 90°, such as at an angle of less than 75°, and in another embodiment, less than or equal to 90°. These configurations may maximize device area utilization by the thermoelectric material for energy conversion purposes, while improving the structure coherence and stability of the resulting structure.

Each thermoelectric cell also may include a conductive component to electrically connect the cell to another thermoelectric cell in the device. The conductive component may include a first conductive element disposed at and providing the electrical connection to the first end of the thermoelectric element. The conductive component also may include a second conductive element disposed at and providing the electrical connection to the second end of the thermoelectric element. The conductive component may further include a third, or transverse, conductive element extending away from the second conductive element at the second end of the thermoelectric element toward a first conductive element at a first end of a thermoelectric element of another thermoelectric cell, to provide an electrical connection between the cells. In one embodiment, the third conductive component may be a strip having a significantly reduced width in comparison to that of the second conductive element, such as having a width less than half that of the second conductive element, to minimize thermal conduction through the electrical connection between cells while still providing sufficiently low electrical resistance.

Each thermoelectric also may include an insulating element occupying the interior of the folded thermoelectric element, to reduce thermal conduction out of the transverse portion of the thermoelectric element extending between the two ends, and provide structural support to the thermoelectric element. The insulating element also may be disposed between the first and second conductive elements electrically connected to the first and second ends of the thermoelectric element, to electrical insulate these conductive elements from each other and again provide structural support to these elements.

Figure 1:
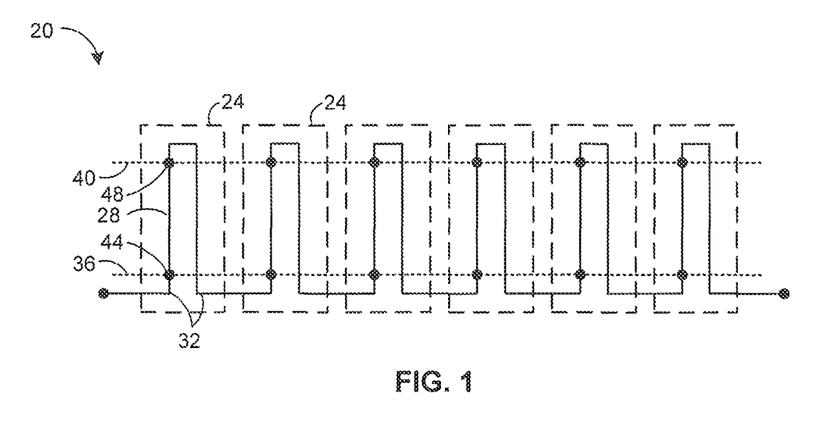
FIG. 1 is a schematic diagram depicting an embodiment of a thermoelectric device.

FIG. 1 is a schematic diagram depicting an embodiment of thermally and electrically conductive components of a thermoelectric device 20 providing one or more of improved power generation, device area utilization, manufacturing simplicity or cost. The thermoelectric device 20 may include a plurality of thermoelectric cells 24. Each thermoelectric cell 24 may include a thermoelectric element 28 and a conductive component 32.

The thermoelectric element 28 may provide a thermal conduction path between a first plane 36 and a second plane 40. The thermoelectric element 28 may be arranged between the first plane 36 and the second plane 40, such as by having a first end 44 positioned at or oriented to the first plane 36 and a second end 48 positioned at or oriented to the second plane 40. The first and second planes 36, 40 may be parallel to each other.

The thermoelectric element 28 of each of the cells 24 may be formed from a thermoelectric material of a same single semiconductor type. In one embodiment, the thermoelectric material may be an n-type semiconductor material having negatively charged electrons as charge carriers. In another embodiment, the thermoelectric material may be a p-type semiconductor material having positive charged holes as charge carriers. The thermoelectric element 28 may be formed from a bismuth telluride alloy doped to be either an n-type semiconductor material or a p-type semiconductor material. Alternatively, the thermoelectric element may be formed from other thermoelectric materials. Forming the thermoelectric device 20 using thermoelectric material of only a single semiconductor type may reduce the complexity and cost of manufacturing the device 20 by reducing the number of manufacturing steps that would be required to provide thermoelectric material of a plurality of different semiconductor types, such as both n-type and p-type semiconductor materials. Forming the thermoelectric device 20 using only a single semiconductor type also may provide improved power generation and device area utilization in cases where the included semiconductor type has superior thermoelectric properties than another semiconductor type not included.

The thermal conduction path may flow in a same direction through each thermoelectric cell 24. For example, in the embodiment of FIG. 1, the thermoelectric device 20 may be used so that the first plane 36 experiences a relatively hotter temperature, the second plane 40 experiences a relatively colder temperature, and heat flows along a thermal conduction path through each thermoelectric cell 24 from the first plane 36 to the second plane 40.

The conductive component 32 of the thermoelectric cell 24 may provide one or more electrical connections between the thermoelectric element 28 of the cell 24 and the thermoelectric element 28 of one or more separate cells 24. In embodiments, the conductive component 32 of each cell 24 may provide a first electrical connection between the first end 44 of the thermoelectric element 28 of that cell 24 arranged at or oriented to the first plane 36 and the second end 48 the thermoelectric element 28 of another cell 24 arranged at or oriented to the second plane 40, and a second electrical connection between the second end 48 of the thermoelectric element 28 of that cell 24 arranged at or oriented to the second plane 40 and the first end 44 the thermoelectric element 28 of another cell 24 arranged at or oriented to the first plane 36.

Conductive elements of the conductive component 32 may be formed from a metal material. In one embodiment, the conductive elements may be formed from gold or a gold alloy. In other embodiments, the conductive elements may be formed from one more other metals or metal alloys.

As indicated, the conductive component 32 may provide an electrical connection between thermoelectric cells. Thus, the thermoelectric device 20 may be configured so that the plurality of thermoelectric cells 24 are electrically connected in series to form a continuous electrical conduction path from one cell 24 to another. For example, in the embodiment of FIG. 1, an electrical conduction path may start at the left-most cell 24 at the first plane 36, travel through the thermoelectric element 28 of that cell 24 from the first plane 36 to the second plane 40, then travel through the conductive component 32 of that cell 24 from the second plane 40 back to the first plane 36, and then repeat this path through the next connected cell 24, and then the next, etc., providing a continuous electrical conduction path from the left-most cell 24 to the right-most cell 24.

Figure 2A:
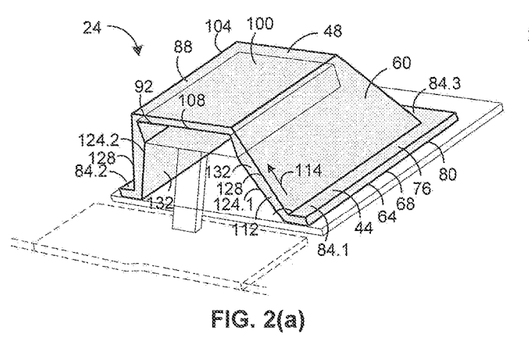
FIGS. 2(a)-2(b) are perspective views depicting an embodiment of a thermoelectric cell of the thermoelectric device, and highlighting details of a thermoelectric element of the cell.
Figure 2B:
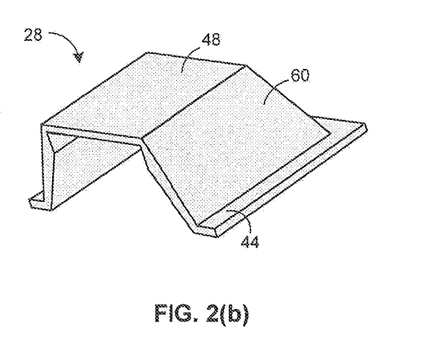

The thermoelectric cells 24 of the thermoelectric device 20 may be provided in a physical form in a manner to enable the improved manufacturing simplicity, cost, power generation and device area utilization. FIGS. 2(*a*)-2(*b*), 3(*a*)-3(*b*) and 4(*a*)-4(*b*) are perspective views depicting an embodiment of the thermoelectric cell 24. The thermoelectric cell 24 may include embodiments of the thermoelectric element 28, the conductive component 32, and an insulating element 34.

FIGS. 2(*a*) and 2(*b*) show details of an embodiment of the thermoelectric element 28 of the thermoelectric cell 24. FIG. 2(*a*) depicts the thermoelectric element 28 highlighted within and showing its relationship to other components of the thermoelectric cell 24, while FIG. 2(*b*) depicts the thermoelectric element 28 alone. As discussed above, the thermoelectric element 28 may be arranged between the first plane 36 and the second plane 40 to provide a thermal conduction path between these planes. The thermoelectric element 28 may include the first end 44 (also referred to herein as a first portion 44) at or oriented to the first plane 36, the second end 48 (also referred to herein as a second portion 48) at or oriented to the second plane 40, and a third portion 60 (also referred to herein as a transverse portion 60) extending between and connecting the first and second ends 44, 48.

The first end 44 of the thermoelectric element 28 may be located at the first plane 36. The first end 44 may include a first thermal conduction surface 64 arranged at the first plane 36 to provide thermal conduction into or out of the thermoelectric element 28. For example, when the thermoelectric device 20 is arranged so that the first plane 36 experiences a relatively hotter temperature, the first thermal conduction surface 64 may receive a heat flow into the thermoelectric element 28. Alternatively, when the thermoelectric device 20 is arranged so that the first plane 36 experiences a relatively colder temperature, the first thermal conduction surface 64 may provide a heat flow out of the thermoelectric element 28.

The first end 44 of the thermoelectric element 28 also may include an electrical connection 68 to a first conductive element 72 of the conductive component 32 of the cell 24. The electrical connection 68 to the first conductive element 72 may serve to provide the electrical connection to the first separate thermoelectric cell 24 electrically connected to the first conductive element 72.

The first end 44 may include a flange or a flange-like element 76 protruding or extending away from the transverse portion 60 of the thermoelectric element 28 in a direction substantially parallel to the first plane 36. The flange element 76 may include a bottom surface 80 serving as one or both of the first thermal conduction surface 64 and the electrical connection 68 to the first conductive element 72. The first end 44 also may include a plurality of legs 84, or subportions 84, connected to each other in such a manner that at least two of the legs 84.1, 84.2 are substantially parallel to and facing each other, and at least one of the legs 84.3 is substantially perpendicular to at least one of the other legs 84.1, 84.2. The above configurations may maximize the surface area of one or both of the first thermal conduction surface 64 or the electrical connection 68 to the first conductive element 72, contributing to the improved thermal and electrical performance of the thermoelectric cell 24, as well as provide structural stability.

The second end 48 of the thermoelectric element 28 may be located at the second plane 40. The second end 48 may include a second thermal conduction surface 88 arranged at the second plane 40 to provide thermal conduction into or out of the thermoelectric element 28. For example, when the thermoelectric device 20 is arranged so that the second plane 40 experiences a relatively colder temperature, the second thermal conduction surface 88 may provide a heat flow out of the thermoelectric element 28. Alternatively, when the thermoelectric device 20 is arranged so that the second plane 40 experiences a relatively hotter temperature, the second thermal conduction surface 88 may receive a heat flow into the thermoelectric element 28.

The second end 48 of the thermoelectric element 28 also may include an electrical connection 92 to a second conductive element 96 of the conductive component 32 of the cell 24. The electrical connection 92 to the second conducive element 96 may serve to provide the electrical connection to a second separate thermoelectric cell 24 via the second conductive element 96. This second separate thermoelectric cell 24 may be a different separate thermoelectric cell 24 than the first separate thermoelectric cell 24 that may be electrically connected to the first end 44 of the thermoelectric element 28 via its connection to the first conductive element 72. That is, as discussed above, the plurality of thermoelectric cells 24 of the thermoelectric device 20 may be electrically connected in series, and the first end 44 of the thermoelectric element 28 may be electrically connected via the first conductive element 72 to the next thermoelectric cell 24 in a first direction along the series connection, whereas the second end 48 of the thermoelectric element 28 may be electrically connected via the second conductive element 96 to the next thermoelectric cell 24 in a second direction along the series connection.

The second end 48 may be formed as or include a cap or a capping element 100 extending in a direction substantially parallel to the second plane 40 to connect different sections 132 of the transverse portion 60 of the thermoelectric element 28. The cap element 100 may include a top surface 104 serving as the second thermal conduction surface 88. The cap element 100 also may include a bottom surface 108 serving as the electrical connection 92 to the second conductive element 96. In one embodiment, the second end 48, such as the cap 100, may be formed as a substantially planar section having surfaces parallel to one or more of the second plane 44 or a surface of the second conductive element 96. The above configurations may maximize the surface area of one or both of the second thermal conduction surface 88 or the electrical connection 92 to the second conductive element 96, contributing to the improved thermal and electrical performance of the thermoelectric cell 24, as well as provide structural stability.

The third, or transverse, portion 60 of the thermoelectric element 28 may extend between and connect the first and second ends 44, 48 of the thermoelectric element 28 to provide a thermal and electrical conduction path between the first and second ends 44, 48. For example, when the thermoelectric device 20 is arranged so that the first plane 36 experiences a relatively hotter temperature and the second plane 44 experiences a relatively colder temperature, the transverse portion 60 may provide a path for heat flow and charge carriers to travel from the first end 44 to the second end 48. Alternatively, when the thermoelectric device 20 is arranged so that the first plane 36 experiences a relatively colder temperature and the second plane 40 experiences a relatively hotter temperature, the transverse portion 60 may provide a path for heat flow and charge carriers to travel from the second end 48 to the first end 44.

The transverse portion 60 of the thermoelectric element 28 may be formed as or include a wall or wall-like element 112 extending from the first end 44 of the thermoelectric element 28 toward the second end 48 of the thermoelectric element 28 along a direction 114 angled to the first and second planes 36, 40. The transverse portion 60 may include an interface to the flange element 76 of the first end 44 and an interface to the cap element 100 of the second end 48. The transverse portion 60, such as, e.g., the wall element 112 of the transverse portion 60, may bend or curve so that it encloses or partially encloses the insulating element 34 of the cell 24, and includes one or more inner surfaces 124 facing an interior of the thermoelectric element 28 and one or more exterior surfaces 128 facing an exterior of the thermoelectric element 28. The transverse portion 60 may include a plurality subportions 132.1, 132.2, 132.3 connected to each other in such a manner that at least two of the inner surfaces 124.1, 124.2 of such subportions 132 face each other and at least one additional inner surface 124.3 faces in a third, different direction. The subportions 132 also may be arranged in such a manner that each of a plurality of outer surfaces 128 faces a corresponding different direction. In one embodiment, the transverse portion 60, such as a wall 112 of the transverse portion, may extend from the first end 44 to the second end 48 in the direction 114 at an angle relative to the first and second planes of less than 90°, such as, e.g., less than 75°. In another embodiment, the transverse portion 60, such as a wall 112 of the transverse portion, may extend from the first end 44 to the second end 48 in the direction 114 at an angle relative to the first and second planes of less than or equal to 90°. The above configurations may optimize the thermal conduction and energy harvesting within the thermoelectric element 28, as well as provide improved device area utilization and structural stability.

As indicated, the second end 48 and transverse portion 60 of the thermoelectric element 28, taken together, may partially surround or enclose a three dimensional space on a plurality of faces of the space. For example, in the embodiment of FIG. 2(a), the second end 48 and transverse portion 60 of the thermoelectric element 28, taken together, may surround or enclose a three dimensional space occupied by the second conductive element 96 and the insulating element 34 on four faces of the space, including a top face by the second end 48 and three side faces by the transverse portion 60.

The thermoelectric element 28 may be a single unitary element formed from the thermoelectric material of the single semiconductor type, with the first end 44, second end 48, and transverse portion 60 being components or portions of the single unitary element, e.g., as depicted in FIGS. 2(a) and 2(b). This configuration may provide improved device area utilization and structural stability and reduced manufacturing complexity and cost, due to, e.g., the unitary nature enabling improved structural coherence and spatial tolerances and reduced number of manufacturing steps.

Figure 3A:
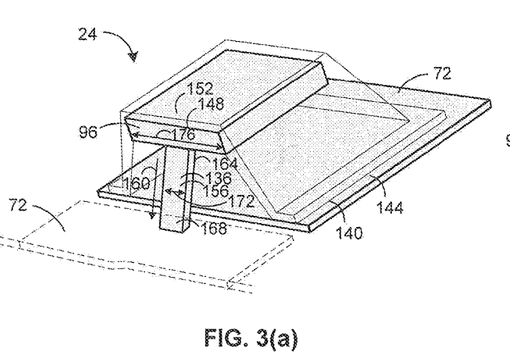
FIGS. 3(a)-3(b) are perspective views depicting an embodiment of the thermoelectric cell and highlighting details of a conductive component of the cell.
Figure 3B:
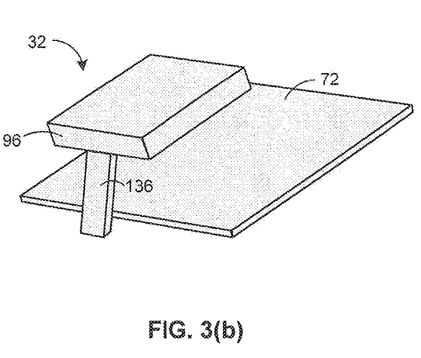

FIGS. 3(a) and 3(b) show details of an embodiment of the conductive component 32 of the thermoelectric cell 24. FIG. 3(a) depicts the conductive component 32 highlighted within and showing its relationship to other components of the thermoelectric cell 24, while FIG. 3(b) depicts the conductive component 32 alone. As discussed above, the conductive component 32 may provide electrical connections between the first end 44 of the thermoelectric element 28 of the cell 24 and a thermoelectric element 28 of a first separate cell 24 and between the second end 48 of the thermoelectric element 28 of the cell 24 and a thermoelectric element 28 of a second separate cell 24. The conductive component 32 may include a first conductive element 72, a second conductive element 96, and a transverse conductive element 136 (also referred to herein as a third conductive element 136).

The first conductive element 72 may include an electrical connection 140 to the first end 44 of the thermoelectric element 28. As discussed above, the first conductive element 72 may serve to provide the electrical connection between the first end 44 of the thermoelectric element 28 and another thermoelectric cell 24 electrically connected to the first conductive element 72. The first conductive element 72 may include a surface 144 contacting a surface of the first end 44 of the thermoelectric element 28 to provide the electrical connection 140. In an embodiment, the first conductive element 72 may be formed underneath the first end 44 of the thermoelectric element 28, such as, e.g., depicted in FIG. 3(a), and may include top surface contacting a bottom surface of the first end of the thermoelectric element to provide the electrical connection 140. In other embodiments, the first conductive element 72 may be formed on top of the first end 44 of the thermoelectric element 28, and may include a bottom surface contacting a top surface of the first end 44 of the thermoelectric element 28 to provide the electrical connection 140.

The first conductive element 72 may include the surface 144 contacting the first end 44 of the thermoelectric element 28 configured to have a shape substantially complimenting, or duplicating, that of the contact surface of the first end 44 of the thermoelectric element 28. For example, when the first end 44 of the thermoelectric element 28 includes a flange or a flange-like element 76 extending in a direction substantially parallel to the first plane 36, the first conductive element 72 may include a contact surface 144 extending in a direction substantially parallel to the first plane 36 and substantially encompassing a contact surface 80 of the flange 76. In an embodiment, the first conductive element 72 may include a substantially planar portion having a contact surface 144 parallel to the first plane 36 and substantially encompassing the contact surface 80 of the first end 44 of the thermoelectric element 28. In some such embodiments, the first conductive element 72 also may optionally include a portion encompassing an interior of a shape formed by the contact surface 80 of the first end 44 of the thermoelectric element 28, such as the interior of the shape formed by the contact surface 80 of the flange 100 depicted in FIG. 2(a). The above configurations may enable the improved electrical performance of the thermoelectric cell 24 by maximizing the surface area of the electrical connection between the first conductive element 72 and the first end 44 of the thermoelectric element 28, and minimizing the electrical resistance presented by the first conductive element 72 to current travelling from any portion of the first end 44 of the thermoelectric element 28.

The second conductive element 96 of the conductive component may include an electrical connection 148 to the second end 48 of the thermoelectric element 28. As discussed above, the second conductive element 96 may serve to provide the electrical connection, via the transverse conductive element 136, between the second end 48 of the thermoelectric element 28 and another thermoelectric cell 24 electrically connected to the transverse conductive element 136, where this second separate thermoelectric cell 24 may be different than a first separate thermoelectric cell 24 that may be electrically connected to the first end 44 of the thermoelectric element 28 via its connection to the first conductive element 72. The second conductive element 96 may include a surface 152 contacting a surface of the second end 48 of the thermoelectric element 28 to provide the electrical connection 148. In an embodiment, the second conductive element 96 may be formed underneath the second end 48 of the thermoelectric element 28, such as, e.g., depicted in FIG. 3(a), and may include a top surface contacting a bottom surface of the second end 48 of the thermoelectric element 28 to provide the electrical connection. In other embodiments, the second conductive element 96 may be formed on top of the second end 48 of the thermoelectric element 28, and may include a bottom surface contacting a top surface of the second end 48 of the thermoelectric element 28 to provide the electrical connection.

The second conductive element 96 may include the surface 152 contacting the second end 48 of the thermoelectric element 28 configured to have a shape substantially complimenting, or duplicating, that of the contact surface of the second end 48 of the thermoelectric element 28. When the second end 48 of the thermoelectric element 28 includes a cap or capping element 100 extending in a direction substantially parallel to the second plane 40, the second conductive element 96 may include the contact surface 152 having a shape substantially duplicating that of such a cap or capping element 100 and extending in a direction substantially parallel to the second plane 40. Similarly, when the second end 48 includes a substantially planar section having surfaces parallel to the first and second planes 36, 40, the second conductive element 96 may include a substantially planar element having a contact surface 152 parallel to a connected surface of the second end 48 and the first and second planes 36, 40. The above configurations may enable the improved electrical performance of the thermoelectric cell 24 by maximizing the surface area of the electrical connection 148 between the second conductive element 96 and the second end 48 of the thermoelectric element 24, as well as provide improved structural stability.

The transverse conductive element 136 may be electrically connected to the second conductive element 96 and extend from the second conductive element 96 to another thermoelectric cell 24, such as to a first conductive element 72 of the other thermoelectric cell 24. As discussed above, the second conductive element 96 and transverse conductive element 136 may provide an electrical connection between the second end 48 of the thermoelectric element 28 and another thermoelectric cell 24.

The transverse portion 136 may include a strip or strip-like element 156 extending from the second conductive element 96 in a direction toward the first plane 36. The strip element 156 may include an interface to the second conductive element 96 at one end and an interface to the other thermoelectric cell 24, such as to the first conductive element 72 of the other thermoelectric cell 24, at another end. In one embodiment, the strip element 156 may extend toward the first plane 36 along a direction 160 angled to the first plane 36 at an angle of less than 90°, such as, e.g., at an angle of less than 75°. In another embodiment, the strip element 156 may extend toward the first plane 36 along a direction 160 angled to the first plane 36 at an angle of less than or equal to 90°. The strip element 156 may include a first surface 164 facing one of the interior surfaces 124 of the thermoelectric element 28 and a second surface 168 facing in a substantially opposite direction. The transverse portion 60, such as, e.g., the strip element 156, may include a width 172 in a direction perpendicular to the direction 160 along which it extends to toward the first plane 36 having a dimension smaller than a dimension of a width 176 of the second conductive element 96 in the same direction. In one embodiment, the transverse portion 60 may include a width 172 having a dimension less than half the width 176 of the second conductive element 96. The above configurations may enable the improved thermal and electrical performance of the thermoelectric cell 24 by minimizing thermal conduction through the transverse conductive portion 136, and thereby forcing more thermal conduction through the thermoelectric element 28 where it may generate electrical energy, while providing a sufficiently low electrical resistance for the electrical connection to another thermoelectric cell 24.

Portions of the conductive component 32 of the thermoelectric cell 24 may be a single unitary element formed from the conductive material of the conductive component 32. For example, the second conductive element 96 and the transverse conductive element 136 may be a single unitary element formed from the conductive material, e.g., as depicted in FIGS. 3(*a*) and 3(*b*). The above configuration may provide improved electrical performance and structural tolerances and coherence, and reduced manufacturing complexity and cost.

Although the thermoelectric cell 24 may include two different, unconnected conductive entities in each cell, such as the first conductive element 72 on one hand, and the combination of the second conductive element 96 and the transverse portion 136 on the other hand, from the perspective of thermoelectric device 20 as a whole, it may be considered as including only one continuous conductive entity, consisting of a first conductive element 72 of one cell 24 and a second conductive element 96 and a transverse conductive portion 136 of another cell 24, per thermoelectric cell 24.

Figure 4A:
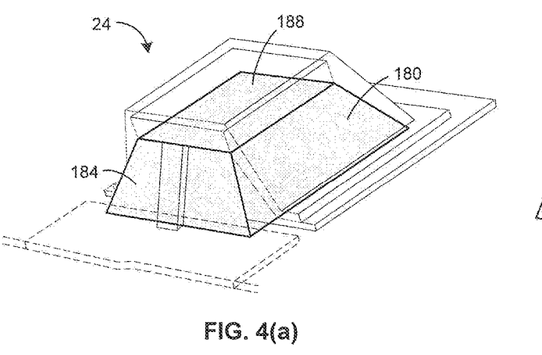
FIGS. 4(a)-4(b) are perspective views depicting an embodiment of the thermoelectric cell and highlighting details of an insulating element of the cell.
Figure 4B:
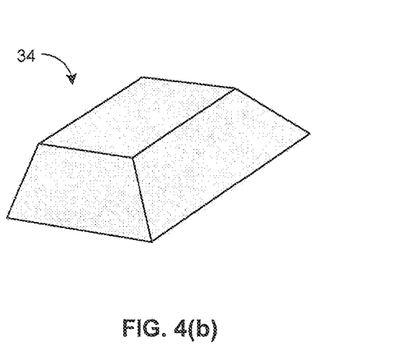
Figure 5A:
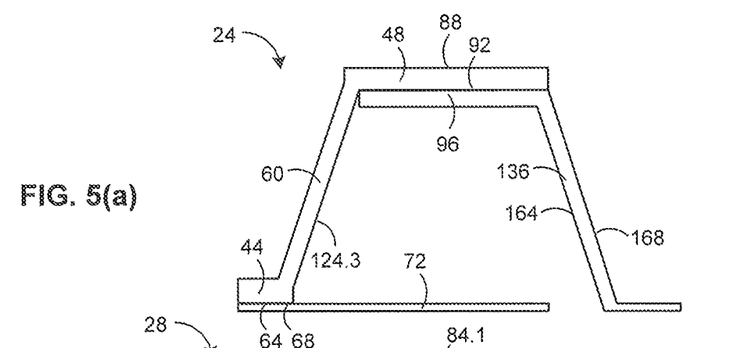
FIG. 5(a) depicts a cross-sectional side view of an embodiment of the thermoelectric element and conductive component.
Figure 5B:
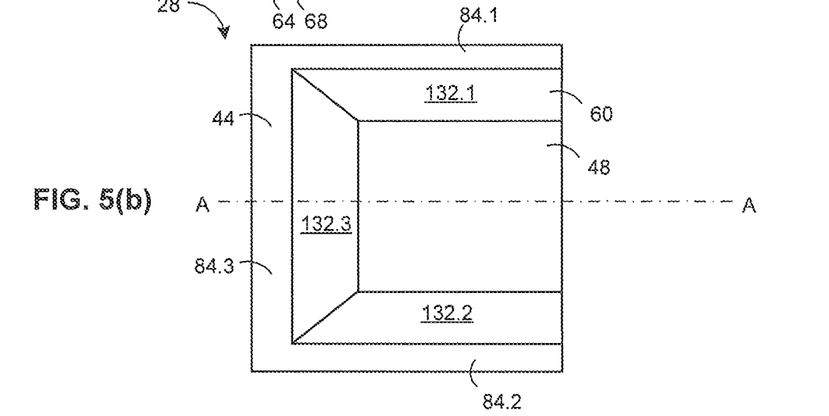
FIGS. 5(b)-5(d) depict top views of the thermoelectric element, a first conductive element, and second and transverse conductive elements depicted in FIG. 5(a).
Figure 5C:
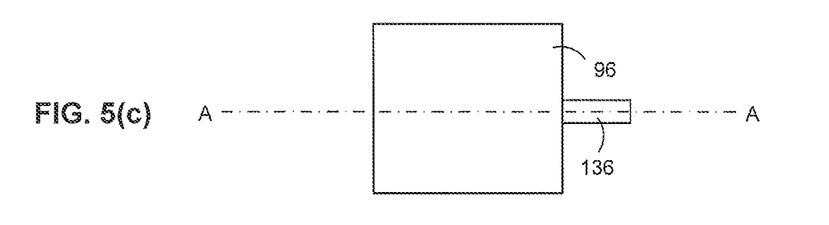
Figure 5D:
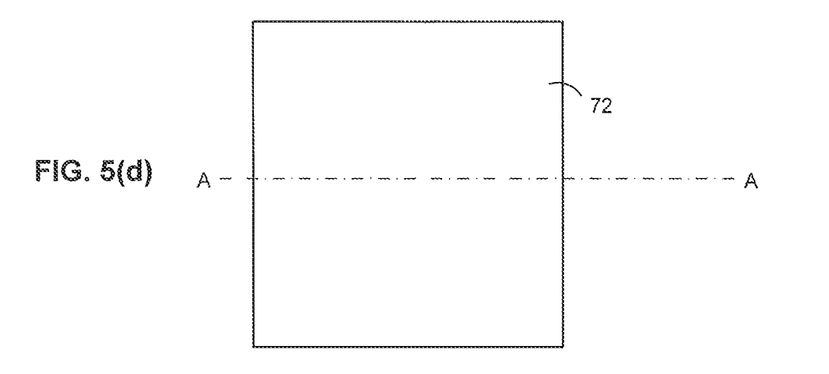

The thermoelectric cell 24 also may include an insulating element 34. FIGS. 4(*a*) and 4(*b*) show details of an embodiment of the insulating element 34 of the thermoelectric cell 24. FIG. 4(*a*) depicts the insulating element 34 highlighted within and showing its relationship to other components of the thermoelectric cell 24, while FIG. 4(*b*) depicts the insulating element 34 alone.

The insulating element 34 may electrically insulate components of the thermoelectric cell 24 from each other. The insulating element 34 may electrically insulate the first conductive element 72 from the second conductive element 96 and the transverse conductive element 136, to enable electrically connections of the thermoelectric element 28 to two different separate thermoelectric cells 24.

The insulating element 34 also may thermally insulate components of the thermoelectric cell 24 from each other. The insulating element 34 may thermally insulate the thermoelectric element 28 from other elements of the thermoelectric cell 24, to maximize the heat flow from the first end 44 of the thermoelectric element 28 to the second end 48 of the thermoelectric element 28 and thus maximize the electrical energy generation, by reducing heat flow out of the transverse portion 60 of the thermoelectric element 28.

The insulating element 34 also may provide structural support to other elements of the thermoelectric cell 24. The insulating element 34 may provide one or more surfaces to support the thermoelectric element 28. For example, the insulating element 34 may provide a plurality of surfaces 180 angled relative to the first plane 36 to support a plurality of surfaces of the transverse portion 60 of the thermoelectric element 28 also angled relative to the first plane 36, as depicted in FIG. 4(*a*). The insulating element 34 also may provide one or more surfaces to support the conductive component 32. For example, the insulating element 34 may provide a surface 184 angled relative to the first plane 36 to support a surface of the transverse conductive element 136 angled relative to the first plane 36 and another surface 188 to support the second conductive element 96, as also depicted in FIG. 4(*a*).

The insulating element 34 also may facilitate manufacture of the thermoelectric device 20. The insulating elements 34 may be formed at one stage of a process to manufacture the thermoelectric device 20, such as after depositing or otherwise forming the first conductive elements 72 of the device 20. The second conductive elements 96 and transverse conductive elements 136 may then be deposited or otherwise formed on top of the insulating elements 34, which may provide an existing three dimensional form that enables a higher quality formation of the second conductive elements 96 and transverse conductive elements 136. The thermoelectric elements 28 may then be deposited or otherwise formed on top of the insulating elements 34 and second conductive elements 96, which again may provide an existing three dimensional form that enables a higher quality formation of the thermoelectric elements 28.

The insulating element 34 may be formed from an insulating material having one or more of electrically insulating, thermally insulating or structurally advantageous properties. In one embodiment, the insulating element 34 may be formed from polyimide, which may possess each of electrically insulating, thermally insulating and structurally advantageous properties. In other embodiments, the insulating element 34 may be formed from other insulating materials.

FIG. 5(*a*) depicts a cross-sectional side view of embodiments of the thermoelectric element 28 and conductive component 32 similar to the embodiments depicted in FIGS. 2(*a*), 2(*b*), 3(*a*) and 3(*c*), and representative of a cross-section A-A depicted in FIGS. 5(*b*)-5(*d*). FIGS. 5(*b*)-5(*d*) depict a top views of the embodiments of the thermoelectric element 28, first conductive element 72, and second and transverse conductive elements 96, 136 depicted in FIG. 5(a), respectively.

Figure 6A:
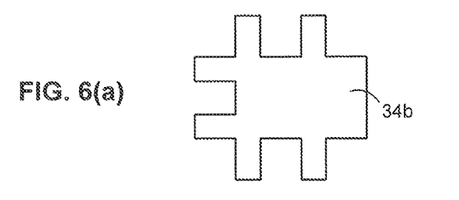
FIGS. 6(a)-6(c) depict top views of additional embodiments of the insulating element, thermoelectric element, and second and transverse conductive elements.
Figure 6B:
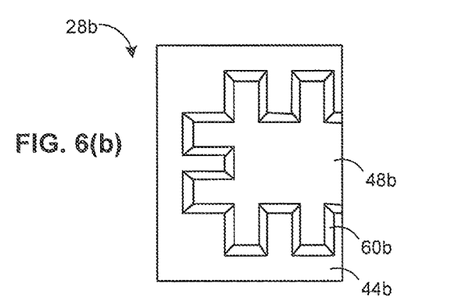
Figure 6C:
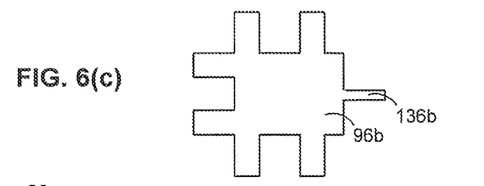
Figure 6D:
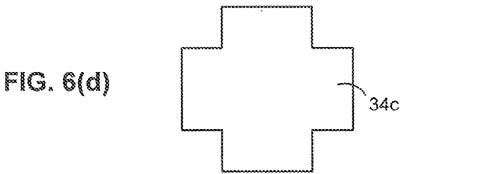
FIGS. 6(d)-6(f) depict top views of yet further embodiments of the insulating element.
Figure 6E:
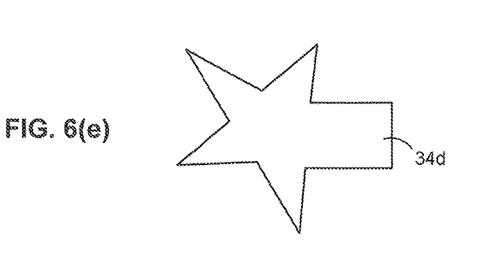
Figure 6F:
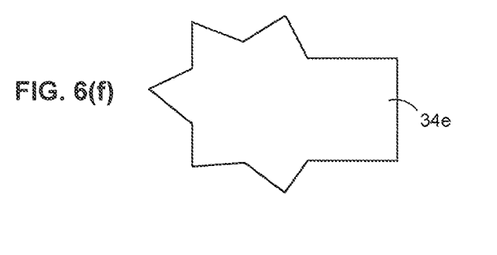

Embodiments of the transverse portion 60 of the thermoelectric element 28 may include different cross-sectional outlines in planes parallel to the first and second planes 36, 40. FIG. 6(a) depicts a top view of an embodiment of the insulating element 34b having a different cross-sectional outline that that depicted in FIGS. 4(a)-4(b). FIG. 6(b) depicts a top view of an embodiment of the thermoelectric element 28b formed on top of the insulating element 34b depicted in FIG. 6(a), and having a corresponding complimentary cross-sectional outline. In FIG. 6(b), the thermoelectric element 28b may include a transverse portion 60b, having a greater number of subportions, such as a greater number of wall sections, and a corresponding greater number of internal surfaces facing the insulating element and external faces facing away from the insulating element, than depicted in FIGS. 3(a)-3(b), and corresponding first and second ends 44b, 48b. FIG. 6(c) depicts a top view of embodiments of the second conductive element 96b and transverse conductive element 136b formed on top of the insulating element 34b depicted in FIG. 6(a). FIGS. 6(d)-6(f) depict top views of additional embodiments of the insulating element 34c, 34d, 34e that may be used to produce embodiments of the thermoelectric element 28 having corresponding complimentary cross-sectional outlines. The above configurations may further enable improved thermal conduction and energy harvesting within the thermoelectric element 28, as well as provide improved device area utilization and structural stability.

Figure 7:
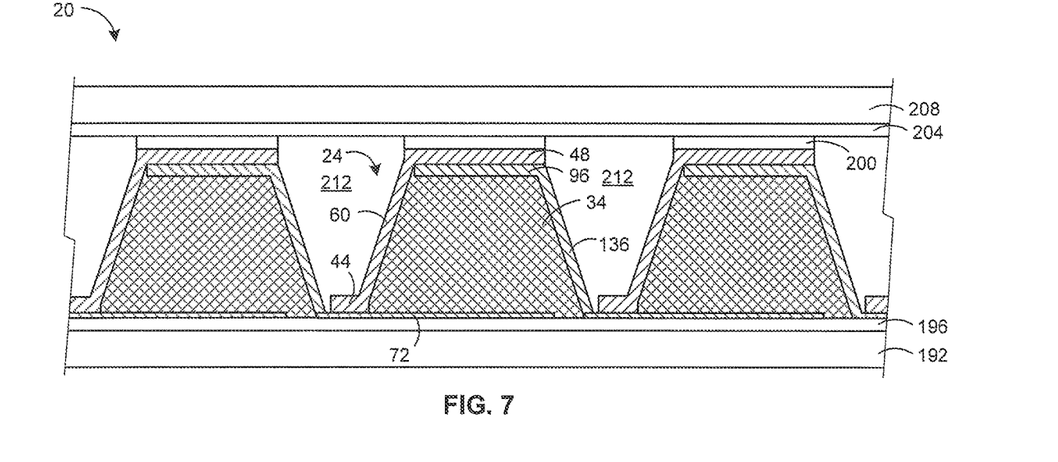
FIG. 7 depicts a cross-sectional view of an embodiment of the thermoelectric device.

FIG. 7 is a cross sectional side view depicting an embodiment of the thermoelectric device 20. The thermoelectric device may include a first substrate 192, one or more layers 196 formed or otherwise disposed on the first substrate 192, a plurality of the thermoelectric cells 24 formed or otherwise disposed on the one more layers 196, one or more additional layers 200, 204 formed or otherwise disposed on the plurality of thermoelectric cells 24 or a capping substrate 208, and the capping substrate 208 disposed above the one more additional layers 204.

The first substrate 192 may be an integrated circuit substrate such as a silicon substrate. The one or more layers 196 disposed on the first substrate 192 may include an electrically insulating layer such as silicon dioxide layer. The one or more layers disposed on the thermoelectric cells 24 or capping substrate 208 may include an adhesive paste layer 200 and an electrically insulating layer 208 such as a silicon dioxide layer. The capping substrate 208 may be an integrated circuit substrate such as a silicon substrate.

The thermoelectric device 20 may be manufactured using integrated circuit manufacturing techniques. In one embodiment, the thermoelectric device 20 may be formed as two components built upon the first substrate 192 and capping substrate 208 and then joined together. The first substrate component may be prepared. The silicon dioxide layer 196 may be grown on the first substrate 192. The plurality of the thermoelectric cells may 24 be formed by depositing one or more layers of conductive material to form the first conductive element 72; depositing, curing or otherwise forming one or more layers of polyimide to form the insulating element 34; depositing one or more layers of conductive material to form the second conductive element 96 and transverse conductive element 136; and depositing, growing, doping or otherwise forming one or more layers of doped bismuth telluride to form the thermoelectric element 28. The capping substrate component also may be prepared. The silicon dioxide layer 204 may be grown on the capping substrate. The adhesive layer 200 may be deposited, printed or otherwise formed on the silicon dioxide layer 204 or on the thermoelectric cells 24. The first substrate component and capping substrate component may be joined to form the thermoelectric device 20.

In an embodiment, spaces 212 between the thermoelectric cells 24 of the thermoelectric device 20 may be occupied by atmosphere, which may provide thermal insulation between thermoelectric cells 24. In another embodiment, the first substrate 192 and capping substrate 208 may be sealed together at side portions and the spaces between the thermoelectric cells 24 of the thermoelectric device 20 may be occupied by a vacuum or low pressure environment, which may provide thermal insulation between thermoelectric cells 24.

In embodiments, integrated circuits or integrated circuit components may be formed on one or more of the substrate 192 and capping substrate 208 along with the thermoelectric device 20, which may be electrically connected to such integrated circuits and/or integrated circuit components.

Figure 8:
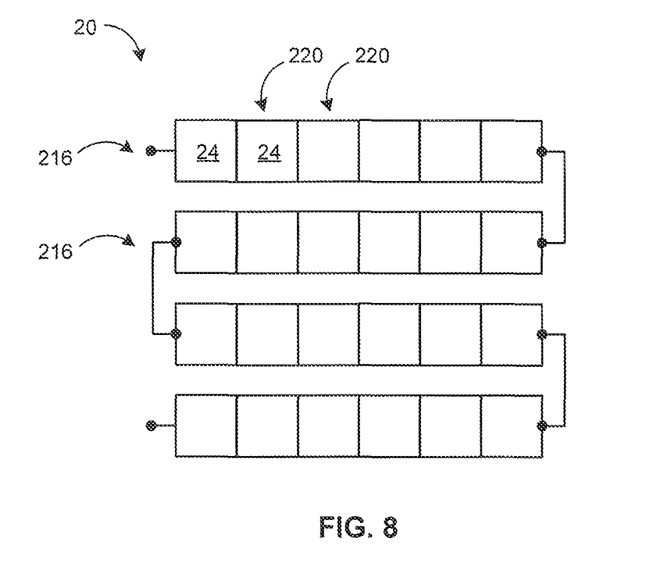
FIG. 8 depicts a top view of an embodiment of an array of a plurality of the thermoelectric cells of the thermoelectric device.

As discussed above, the thermoelectric device 20 may include a plurality of thermoelectric cells 24 electrically connected in series. In one embodiment, the thermoelectric device 20 may be physically implemented as a two dimensional array of the plurality of thermoelectric cells 24, such as formed on an integrated circuit substrate. The thermoelectric cells 24 in the array may be connected into a series combination in different ways. FIG. 8 depicts an embodiment of the thermoelectric device 20 in which a plurality of thermoelectric cells 24 are arranged in a two dimensional array having a plurality of rows 216 and a plurality of columns of cells 220. The plurality of thermoelectric cells 24 may be connected into a single series combination by electrically connecting adjacent cells in the rows 216 and electrically connecting selected cells in columns 220 at the end of the 216 rows to interconnect the rows. In other embodiments, an array of a plurality of cells 24 may be connected into a single series combination using a different pattern of interconnections, or connected into a plurality of series combinations, such as each row or column of a two dimensional array being a separate single series combination.

Each thermoelectric cell 24 may be considered as having a first electric terminal at the first conductive element 72 and a second electric terminal at the end of the transverse conductive element 136. Each cell 24 may generate a corresponding current flow and voltage between the first and second terminals in response to a heat transfer between the first and second planes 36, 40. A series connected combination of thermoelectric cells 24 of embodiments of the thermoelectric device 20 may generate a corresponding current equal to the current flow of each of the cells 24 and a corresponding voltage equal to the sum of the voltages of each of the cells 24 between a first terminal of a cell 24 at one end of the series combination and a second terminal of a cell 24 at the other end of the series combination.

The thermoelectric device 20 may be operated to convert thermal energy to electric energy, i.e., according to the Seebeck effect, such as discussed above, or to convert electric energy to a heat transfer, i.e., according to the Peltier effect.

Relative spatial terms such as top, bottom and side, among others, are used herein to describe relative spatial relationships, and in embodiments the indicated relationships may be reversed or otherwise altered when viewed from a different spatial perspective, such as by inverting, rotating or otherwise changing the orientation of a view of the thermoelectric device.

Additional embodiments of the thermoelectric device 20 and thermoelectric cell 24 are possible. For example, any feature of any of the embodiments of the thermoelectric device 20 and thermoelectric cell 24 described herein can optionally be used in any other embodiment of the thermoelectric device 20 or thermoelectric cell 24. Also, embodiments of the thermoelectric device 20 and thermoelectric cell 24 can optionally include any subset of the components or features of the thermoelectric device 20 or thermoelectric cell 24.

What is claimed is:

1. A single-semiconductor thermoelectric device, comprising:
    a first substrate;
    a second substrate;
    a first thermoelectric element of a first semiconductor type having a first planar surface connected to the first substrate, a second planar surface connected to the second substrate, two surfaces oriented at an acute angle to each other, each forming part of a thermoelectric path between the first planar surface and the second planar surface, and an insulating element disposed between the two surfaces oriented at the acute angle to each other;
    a second thermoelectric element of the same first semiconductor type as the first thermoelectric element, the second thermoelectric element having a first end contacting the first substrate and a second end contacting the second substrate; and
    a conductor extending between the first and second substrates and providing electrical connection from the second planar surface of the first thermoelectric element to the first end of the second thermoelectric element.

2. The single-semiconductor thermoelectric device of claim 1, wherein the insulating element has a plurality of surfaces supporting the first thermoelectric element.

3. The single-semiconductor thermoelectric device of claim 1, wherein the conductor extending between the first and second substrates is a first conductor, and the first thermoelectric element further comprises a second conductor disposed at the first planar surface of the first thermoelectric element and separated from the first conductor by the insulating element.

4. The single-semiconductor thermoelectric device of claim 1, wherein the first planar surface of the first thermoelectric element comprises a flange that protrudes from the two surfaces oriented at the acute angle to each other in at least one direction parallel to the first substrate.

5. The single-semiconductor thermoelectric device of claim 1, wherein the conductor comprises a portion extending away from the second planar surface of the first thermoelectric element and having a width, in a direction perpendicular to a direction of the portion extending away from the second planar surface of the first thermoelectric element, that is less than half of a width of a portion of the conductor connected to the first thermoelectric element.

6. The single-semiconductor thermoelectric device of claim 1, wherein the first thermoelectric element comprises a portion extending from the first planar surface to the second planar surface, the portion contacting a plurality of surfaces of the conductor.

7. The single-semiconductor thermoelectric device of claim 1, wherein the two surfaces oriented at the acute angle to each other are angled relative to the first substrate at an angle of less than 75°.

8. The single-semiconductor thermoelectric device of claim 1, wherein the two surfaces oriented at the acute angle to each other are angled relative to the first substrate.

9. The single-semiconductor thermoelectric device of claim 1, wherein the conductor comprises a strip that extends toward the first substrate in a direction angled relative to the first substrate at an angle of less than 75°.

10. The single-semiconductor thermoelectric device of claim 1, wherein the conductor comprises a strip that extends toward the first substrate in a direction angled relative to the first substrate.

11. The single-semiconductor thermoelectric device of claim 1, further comprising: a plurality of thermoelectric elements of the first semiconductor type electrically connected in series, the plurality of thermoelectric elements comprising the first and second thermoelectric elements.

12. The single-semiconductor thermoelectric device of claim 1, wherein the first thermoelectric element of the first semiconductor type comprises bismuth telluride.

13. The single-semiconductor thermoelectric device of claim 1, wherein the conductor comprises a metal.

14. The single-semiconductor thermoelectric device of claim 2, wherein the insulating element comprises polyimide.

15. The single-semiconductor thermoelectric device of claim 1, wherein the first substrate is an integrated circuit substrate, wherein the first and second thermoelectric elements are formed on the integrated circuit substrate.

16. A single-semiconductor thermoelectric device, comprising:
    a first substrate;
    a second substrate; and
    a thermoelectric cell comprising:
        a first thermoelectric element of a first semiconductor type comprising a first planar surface connected to the first substrate, and a second planar surface connected to the second substrate, two surfaces oriented at an acute angle to each other, each forming part of a thermoelectric path between the first planar surface and the second planar surface, and an insulating element disposed between the two surfaces oriented at the acute angle to each other;
        a second thermoelectric element of the same first semiconductor type as the first thermoelectric element, the second thermoelectric element having a first end connected to the first substrate and a second end connected to the second substrate; and
        a conductor extending between the first and second substrates and providing electrical connection from the second planar surface of the first thermoelectric element to the first end of the second thermoelectric element.

17. The single-semiconductor thermoelectric device of claim 16, wherein the insulating element has a plurality of surfaces supporting the first thermoelectric element.

18. The single-semiconductor thermoelectric device of claim 16, wherein the first thermoelectric element further comprises a portion extending between the first planar surface and the second planar surface and extending away from the two surfaces oriented at the acute angle to each other in at least one direction parallel to the first substrate.

19. The single-semiconductor thermoelectric device of claim 18, wherein the portion of the thermoelectric element contacts a plurality of sides of the conductor.

20. A single-semiconductor thermoelectric device, comprising:
- a substrate;
- a cap; and
- a thermoelectric structure for converting thermal energy to electric energy using only a single semiconductor type disposed between the substrate and the cap, the thermoelectric structure comprising a first planar surface connected to the substrate, a second planar surface connected to the cap, two surfaces oriented at an acute angle to each other, each forming part of a thermoelectric path between the first planar surface and the second planar surface, and an insulating element disposed between the two surfaces oriented at the acute angle to each other.

* * * * *